US012641726B2

(12) United States Patent
Lee et al.

(10) Patent No.: US 12,641,726 B2
(45) Date of Patent: May 26, 2026

(54) PRINTED CIRCUIT BOARD

(71) Applicant: SAMSUNG ELECTRO-MECHANICS CO., LTD., Suwon-si (KR)

(72) Inventors: Seung Eun Lee, Suwon-si (KR); Ki Hwan Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 210 days.

(21) Appl. No.: 18/625,488

(22) Filed: Apr. 3, 2024

(65) Prior Publication Data

US 2025/0071902 A1     Feb. 27, 2025

(30) Foreign Application Priority Data

Aug. 25, 2023     (KR) ......................... 10-2023-0111716

(51) Int. Cl.
| | |
|---|---|
| *H05K 1/00* | (2006.01) |
| *H05K 1/03* | (2006.01) |
| *H05K 1/11* | (2006.01) |
| *H05K 1/16* | (2006.01) |

(52) U.S. Cl.
CPC ........... *H05K 1/162* (2013.01); *H05K 1/0306* (2013.01); *H05K 1/115* (2013.01); *H05K 2201/09509* (2013.01); *H05K 2201/09545* (2013.01)

(58) Field of Classification Search
CPC ...... H05K 1/162; H05K 1/0306; H05K 1/115; H05K 2201/09509; H05K 2201/09545
See application file for complete search history.

(56) References Cited

U.S. PATENT DOCUMENTS

| | | | |
|---|---|---|---|
| 10,159,152 B2 * | 12/2018 | Campbell ............ | H05K 1/0231 |
| 2013/0248234 A1 * | 9/2013 | Inagaki .................. | H05K 1/183 |
| | | | 174/260 |
| 2014/0131084 A1 * | 5/2014 | Lee ..................... | H05K 1/0231 |
| | | | 174/260 |
| 2015/0027757 A1 | 1/2015 | Shin et al. | |

FOREIGN PATENT DOCUMENTS

| | | | | | |
|---|---|---|---|---|---|
| CN | 116156750 A | * | 5/2023 | ............. | H05K 1/183 |
| JP | 2023-052130 A | | 4/2023 | | |
| KR | 10-2010-0080633 A | | 7/2010 | | |
| KR | 10-2015-0014167 A | | 2/2015 | | |
| WO | WO-2019225698 A1 | * | 11/2019 | ....... | H01L 23/49816 |

* cited by examiner

*Primary Examiner* — Pete T Lee
(74) *Attorney, Agent, or Firm* — Morgan, Lewis & Bockius LLP

(57) ABSTRACT
The present disclosure relates to a printed circuit board including: a glass layer; a plurality of blind cavities respectively penetrating through a portion of the glass layer from an upper surface or a lower surface of the glass layer; a plurality of passive elements respectively disposed in the plurality of blind cavities; and an insulating layer covering at least a portion of each of the glass layer and the plurality of passive elements and disposed in at least a portion of each of the plurality of blind cavities. At least two of the plurality of blind cavities have different depths.

20 Claims, 17 Drawing Sheets

100A

500A

100B

C1  151  p  v                P    C2  152

125
133
123
160
121
132
131
122
160
124
134
126

112
170
137
111
137

132v C3 153 131v  H          155          C4  154 131v  132v

500B

C1  151  p  v                P    C2    152

200

127
135
125
133
123
160
121
132
131
122
160
124
134
126
136
128

210
141
113
112
170
137
111
137

114
142

132v C3 153 131v  H          155          C4  154 131v  132v

PRINTED CIRCUIT BOARD

CROSS-REFERENCE TO RELATED APPLICATION(S)

This application claims benefit of priority to Korean Patent Application No. 10-2023-0111716 filed on Aug. 25, 2023, in the Korean Intellectual Property Office, the disclosure of which is incorporated herein by reference in its entirety.

TECHNICAL FIELD

The present disclosure relates to a printed circuit board.

With high performance of a semiconductor, a size of a package substrate continues to increase, and a thickness of a core is continuously increasing to reduce warpage of a large-area substrate. Recently, there has been a demand to reduce a core thickness in order to reduce a pitch of a through-via formed in the core, and accordingly, application of a glass core is being considered. In the case of high-performance semiconductor to which the glass core is applied, it is necessary to embed a passive element to improve power efficiency and power integrity characteristics, and to improve performance, various types of passive elements such as a ceramic capacitor or a silicon capacitor may be required to improve performance.

SUMMARY

An aspect of the present disclosure is to provide a printed circuit board having excellent warpage control by an application of a glass layer.

Another aspect of the present disclosure is to provide a printed circuit board that may embed various types of passive devices in a glass layer.

Another aspect of the present disclosure is to provide a printed circuit board that may increase capacitance, reduce parasitic inductance ESL, and reduce a path of power.

One of various solutions proposed through the present disclosure is to form blind cavities having various depths in a glass layer applied as a core layer of a substrate, further form a through-cavity as necessary, and dispose and embed a passive element or an electronic component including various types of capacitors in the blind cavity and the through-cavity, respectively.

For example, according to an aspect of the present disclosure, provided is a printed circuit board including: a glass layer; a plurality of blind cavities respectively penetrating through a portion of the glass layer from an upper surface or a lower surface of the glass layer; a plurality of passive elements respectively disposed in the plurality of blind cavities; and an insulating layer covering at least a portion of each of the glass layer and the plurality of passive elements and disposed in at least a portion of each of the plurality of blind cavities. At least two of the plurality of blind cavities have different depths.

For example, according to an aspect of the present disclosure, provided is a printed circuit board including: a glass layer; a blind cavity penetrating through a portion of the glass layer from an upper surface or a lower surface of the glass layer; a through-cavity penetrating between the upper surface and the lower surface of the glass layer; a passive element disposed in the blind cavity; an electronic component disposed in the through-cavity; and an insulating layer covering at least a portion of each of the glass layer, the passive element, and the electronic component, and disposed in at least a portion of each of the blind cavity and the through-cavity.

For example, according to an aspect of the present disclosure, provided is a printed circuit board including: a glass layer; a first blind cavity penetrating through a portion of the glass layer from an upper surface of the glass layer; a second blind cavity penetrating through another portion of the glass layer from a lower surface of the glass layer; first and second passive elements respectively disposed in the first and second blind cavities, and connected to each other through a first via layer disposed in a portion of the glass layer between the first blind cavity and the second glass cavity; and an insulating layer covering at least a portion of each of the glass layer and the first and second passive elements and disposed in at least a portion of the first and second blind cavities.

An effect of the present disclosure is to provide a printed circuit board having excellent warpage control by an application of a glass layer.

Another effect of the present disclosure is to provide a printed circuit board that may embed various types of passive devices in a glass layer.

Another effect of the present disclosure is to provide a printed circuit board that may increase capacitance, reduce parasitic inductance ESL, and reduce a path of power.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
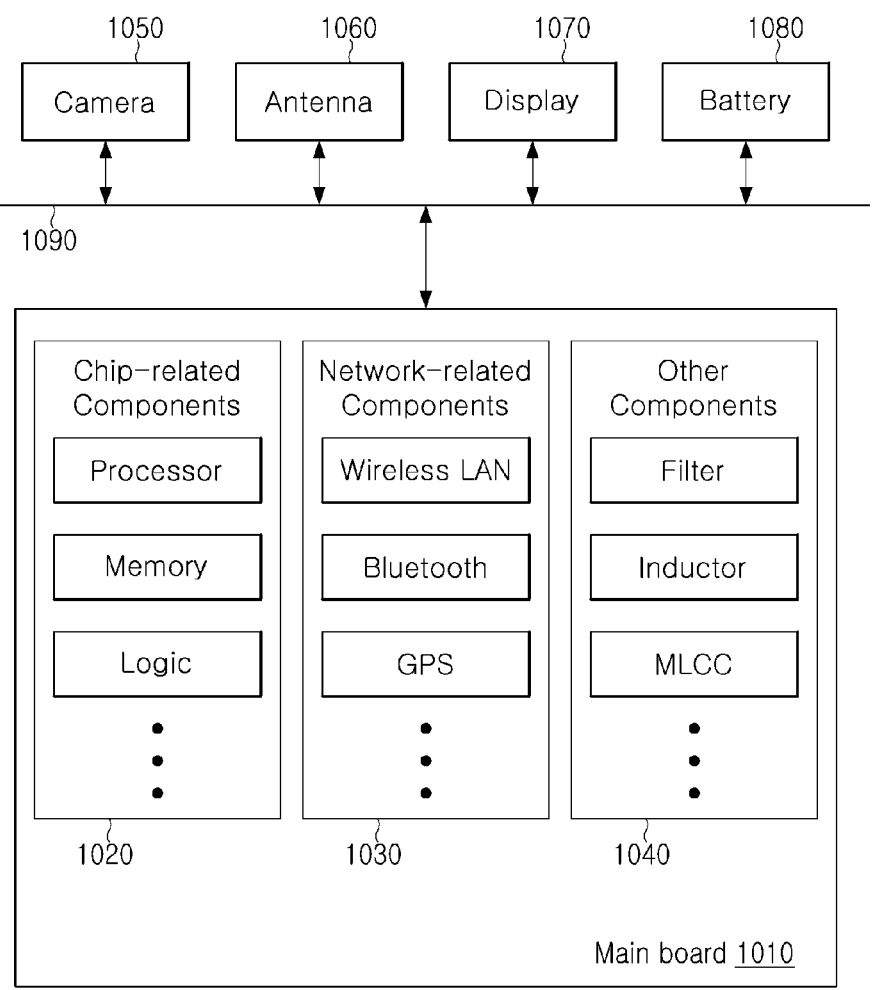
FIG. 1 is a block diagram schematically illustrating an example embodiment of an electronic device system.

Hereinafter, the present disclosure will be described with reference to the accompanying drawings. In the drawings, the shape and size of the elements may be exaggerated or reduced for clearer description.

Electronic Device

FIG. 1 is a block diagram schematically illustrating an example of an electronic device system.

Referring to FIG. 1, an electronic device 1000 accommodates a main board 1010 therein. Chip-related components 1020, network-related components 1030, and other components 1040, and the like, are physically and/or electrically connected to the main board 1010. These components are also coupled to other electronic components to be described below to form various signal lines 1090.

The chip-related components 1020 may include a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital (ADC) converter, an application-specific IC (ASIC), or the like. However, the chip-related components 1020 are not limited thereto, and may also include other types of chip-related electronic components. Furthermore, the chip-related components 1020 may be coupled to each other. The chip-related component 1020 may have the form of a package including the above-described chip or electronic component.

The network-related components 1030 may include wireless fidelity (Wi-Fi) (such as IEEE 802.11 family), worldwide interoperability for microwave access (WiMAX) (such as IEEE 802.16 family), IEEE 802.20, long term evolution (LTE), evolution data only (Ev-DO), HSPA+, HSDPA+, HSUPA+, EDGE, GSM, GPS, GPRS, CDMA, TDMA, DECT, Bluetooth, 3G, 4G, and 5G protocols, and any other wireless and wired standards or protocols specified thereafter. However, the network-related components 1030 are not limited thereto, and may also include any of a number of other wireless or wired standards or protocols. Furthermore, the network-related components 1030 may be coupled to the chip-related components 1020.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), or the like. However, other components are not limited thereto, and may also include passive components in the form of chip components used for various other purposes. In addition, other components 1040 may be coupled to each other, together with the chip-related components 1020 and/or the network-related components 1030.

Depending on a type of electronic device 1000, the electronic device 1000 may include other electronic components that may or may not be physically and/or electrically connected to main board 1010. These other electronic components may include, for example, a camera module 1050, an antenna module 1060, a display 1070, and a battery 1080. However, these other electronic components are not limited thereto, but may also include an audio codec, a video codec, a power amplifier, a compass, an accelerometer, a gyroscope, a speaker, a mass storage device (e.g., a hard disk drive), a compact disk (CD), a digital versatile disk (DVD), or the like. In addition thereto, other electronic components used for various purposes depending on a type of electronic device 1000 may be included.

The electronic device 1000 may be a smartphone, a personal digital assistant, a digital video camera, a digital still camera, a network system, a computer, a monitor, a tablet PC, a laptop PC, a netbook PC, a television, a video game machine, a smartwatch, an automotive component. However, the electronic device 1000 is not limited thereto, and may be any other electronic device that processes data in addition thereto.

Figure 2:
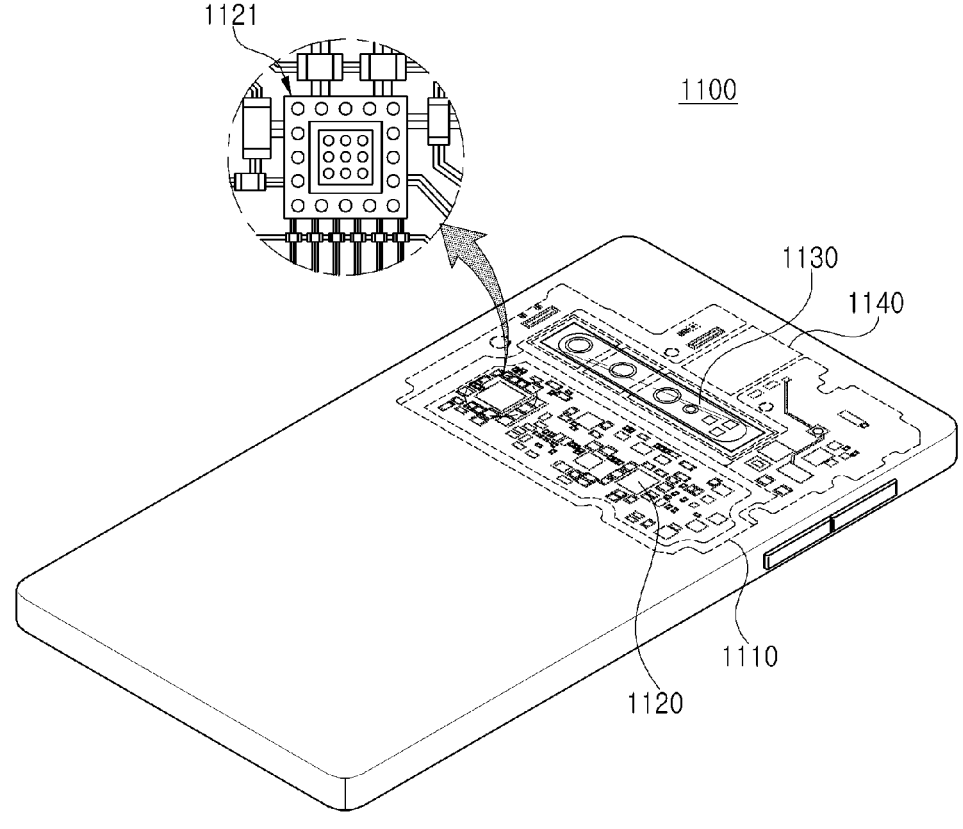
FIG. 2 is a perspective view schematically illustrating an example embodiment of an electronic device.

FIG. 2 is a perspective view schematically illustrating an example of an electronic device.

Referring to FIG. 2, an electronic device may be, for example, a smartphone 1100. A motherboard 1110 may be accommodated in the smartphone 1100, and various components 1120 may be physically and/or electrically connected to the motherboard 1110. Furthermore, other components that may or may not be physically and/or electrically connected to the motherboard 1110, such as a camera module 1130 and/or a speaker 1140, may be accommodated in the smartphone 1100. Some of the components 1120 may be the chip-related components described above, for example, the component package 1121, but the present disclosure is not limited thereto. The component package 1121 may have the form of a printed circuit board in which an electronic component including an active component and/or a passive component is mounted on a surface. Alternatively, the component package 1121 may have the form of a printed circuit board in which an active component and/or a passive component are embedded. On the other hand, the electronic device is not necessarily limited to the smartphone 1100, and may be other electronic devices as described above.

Printed Circuit Board

Figure 3:
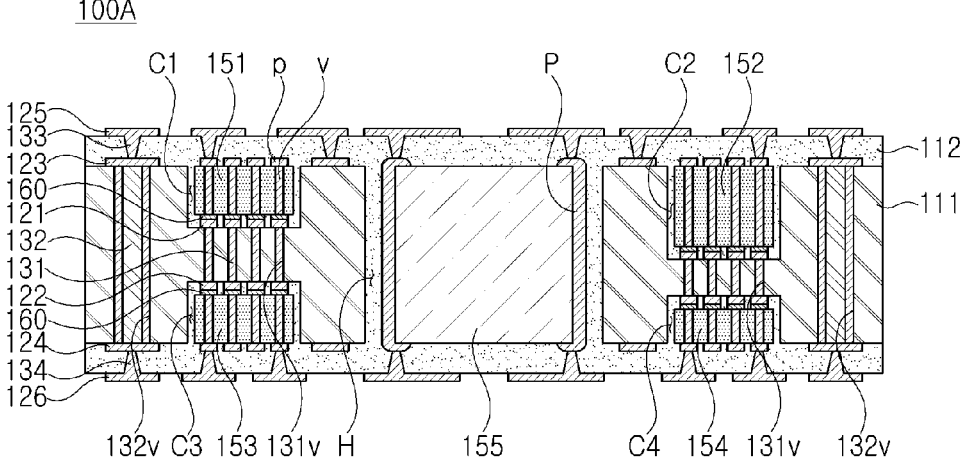
FIG. 3 is a cross-sectional view schematically illustrating an example embodiment of a printed circuit board.

FIG. 3 is a cross-sectional view schematically illustrating an example embodiment of a printed circuit board.

Referring to FIG. 3, a printed circuit board 100A according to an example embodiment may include a glass layer 111, first to fourth blind cavities C1, C2, C3 and C4 respectively penetrating through a portion of the glass layer 111 from an upper surface or a lower surface of the glass layer 111, first to fourth passive elements 151, 152, 153 and 154 disposed in each of the first to fourth blind cavities C1, C2, C3 and C4, a through-cavity H penetrating between the upper surface and the lower surface of the glass layer 111, an electronic component 155 disposed in the through-cavity H, and an insulating layer 112 covering at least a portion of each of the glass layer 111, the first to fourth passive elements 151, 152, 153 and 154, and the electronic component 155, and filling at least a portion of each of first to fourth blind cavities C1, C2, C3 and C4. At least two of the first to fourth blind cavities C1, C2, C3 and C4 may have different depths. Based on a thickness direction, the first and third blind cavities C1 and C3 may at least partially overlap each other, and the second and fourth blind cavities C2 and C4 may overlap at least partially each other. The electronic component 155 may be thicker than each of the first to fourth passive elements 151, 152, 153 and 154. For example, the electronic component 155 may include a high-capacity ceramic capacitor, and each of the first to fourth passive elements 151, 152, 153 and 154 may include a silicon capacitor having a low parasitic inductance (ESL).

In this manner, the printed circuit board 100A according to an example embodiment may include a glass layer 111 as a core layer, and thus, warpage may be easily controlled even in various situations. Furthermore, first to fourth blind cavities C1, C2, C3 and C4 having various depths may be formed in the glass layer 111, and the first to fourth passive elements 151, 152, 153 and 154 may be appropriately disposed in the first to fourth blind cavities C1, C2, C3 and C4 having various depths, and if necessary, a through-cavity H may be further formed, and the electronic component 155 may be disposed in the through-cavity H. In this case, the first to fourth passive elements 151, 152, 153 and 154 and the electronic component 155 may include various types of capacitors. Accordingly, various types of capacitors may be disposed in various positions on a board, thereby improving power efficiency as well as improving signal integrity (SI) and power integrity (PI) characteristics. Additionally, the first and third passive elements 151 and 153 may be connected to each other in parallel, and the second and fourth passive elements 152 and 154 may be connected in parallel. Accordingly, effects such as an increase in capacitance, a decrease in parasitic inductance (ESL), and a decrease in a path of power may be achieved.

Meanwhile, the printed circuit board 100A according to an example embodiment may further include a first wiring layer 121 disposed on bottom surfaces of the first and second blind cavities C1 and C2, a second wiring layer 122 disposed on bottom surfaces of the third and fourth blind cavities C3 and C4, third and fourth wiring layers 123 and 124 respectively disposed on the upper surface and the lower surface of the glass layer 111, fifth and sixth wiring layers 125 and 126 respectively disposed on the upper surface and the lower surface of the insulating layer 112, a first via layer 131 penetrating through the glass layer 111 between the first and third blind cavities C1 and C3 and between the second and fourth blind cavities C2 and C4, a second via layer 132 penetrating between the upper surface and the lower surface of the glass layer 111, a third via layer 133 penetrating through a portion of an upper side of the insulating layer 112, and a fourth via layer 134 penetrating through a portion of a lower side of the insulating layer 112. Each of the first to fourth passive elements 151, 152, 153 and 154 may include a through-silicon via v, and the through-silicon vias v of each of the first to fourth passive elements 151, 152, 153 and 154 may be connected to at least a portion of each of the first and second wiring layers 121 and 122 through a first electrical connection metal 160. Each of the first to fourth passive elements 151, 152, 153 and 154 may have a connection pad p, and the connection pads p of each of the first to fourth passive elements 151, 152, 153 and 154 may be connected to at least a portion of the fifth and sixth wiring layers 125 and 126 through at least a portion of each of the third and fourth via layers 133 and 134. The electronic component 155 may have an external electrode P, and the external electrode P of the electronic component 155 may be connected to at least a portion of each of the fifth and sixth wiring layers 125 and 126 through at least a portion of each of the third and fourth via layers 133 and 134.

In this manner, in the printed circuit board 100A according to an example embodiment, first and second wiring layers 121 and 122 may be disposed on bottom surfaces of each of the first to fourth blind cavities C1, C2, C3 and C4, and the first to fourth passive elements 151, 152, 153 and 154 may be connected to the first and second wiring layers 121 and 122, respectively. Additionally, each of the first to fourth passive elements 151, 152, 153 and 154 may include a through-silicon via v. Accordingly, parallel connection between silicon capacitors may be more easily implemented. Furthermore, the first to fourth passive elements 151, 152, 153 and 154 and the electronic component 155 may be more easily electrically connected to the first to sixth wiring layers 121, 122, 123, 124, 125 and 126 in the board. Therefore, power efficiency may be improved more effectively, and signal integrity (SI) and power integrity (PI) characteristics may be improved more effectively. Furthermore, an increase in capacitance, a decrease in parasitic inductance (ESL), and a decrease in a path of power may be implemented more effectively.

Hereinafter, components of the printed circuit board 100A according to an example will be described in more detail with reference to the drawings.

The glass layer 111 may include glass, which is an amorphous solid. The glass may include, for example, pure silicon dioxide (about 100% $SiO_2$), soda lime glass, borosilicate glass, and alumino-silicate glass. However, the present disclosure is not limited thereto, and alternative glass materials such as fluorine glass, phosphate glass, chalcogen glass, and the like, may also be used as materials. Additionally, other additives may be further included to form glass with specific physical properties. These additives may include calcium carbonate (e.g. lime) and sodium carbonate (e.g. soda), as well as magnesium, calcium, manganese, aluminum, lead, boron, iron, chromium, potassium, sulfur and antimony, and carbonates and/or oxides of these elements and other elements. The glass layer 111 may be a layer that is distinct from organic insulating materials including a glass fiber (Glass Fiber, Glass Cloth or Glass Fabric), for example, copper clad laminate (CCL) and prepreg (PPG). For example, the glass layer 111 may include plate glass.

The insulating layer 112 may include an insulating material. The insulating material may include a thermosetting resin such as an epoxy resin, a thermoplastic resin such as polyimide, or materials including an inorganic filler, an organic filler, and/or a glass fiber (Glass Fiber, Glass Cloth or Glass Fabric) along with resins. For example, the insulating material may be a non-photosensitive insulating material such as an Ajinomoto Build-up Film (ABF) or Prepreg (PPG), but the present disclosure is not limited thereto, and other polymer materials may be used. Additionally, the insulating material may be a photosensitive insulating material such as Photoimageable Dielectric (PID). The insulating layer 112 may include a plurality of layers, but boundaries thereof may be unclear after curing.

Each of the first to sixth wiring layers 121, 122, 123, 124, 125 and 126 may include a metallic material. The metal material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. Each of the first to sixth wiring layers 121, 122, 123, 124, 125 and 126 may perform various functions depending on the design. For example, the first to sixth wiring layers 121, 122, 123, 124, 125 and 126 may include a signal pattern, a power pattern, and a ground pattern. Each of these patterns may have various forms such as a line, a plane, and a pad. The first to sixth wiring layers 121, 122, 123, 124, 125 and 126 may include an electroless plating layer (or chemical copper) and an electrolytic plating layer (or electrical copper), respectively. Alternatively, the first to sixth wiring layers 121, 122, 123, 124, 125 and 126 may include a metal foil (or copper foil) and an electrolytic plating layer (or electrolytic copper). Alternatively, the first to sixth wiring layers 121, 122, 123, 124, 125 and 126 may include a metal foil (or copper foil), an electroless plating layer (or chemical copper), and an electrolytic plating layer (or electrolytic copper). The first to sixth wiring layers 121, 122, 123, 124, 125 and 126 may include a sputtering layer instead of an electroless plating layer (or chemical copper), and may include both the electroless plating layer (or chemical copper) and the sputtering layer, if necessary.

The first and second via layers 131 and 132 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. The first and second via layers 131 and 132 may include through-glass vias. For example, the glass through-hole of the first via layer 131 may include a Plated Through-Hole (PTH) formed by filling a first through-hole 131v penetrating through the glass layer 111 with the above-described metallic material by plating. The glass through-via of the second via layer 132 may include a Plated Through-Hole (PTH) formed conformally by plating the above-described metallic material on a wall surface of the second through-hole 132v penetrating through the glass layer 111, and by filling an interior of the second through-hole 132v with an insulating material. The glass through-vias of the first and second via layers 131 and 132 may perform various functions depending on the design of a corresponding layer. For example, the first and second via layers 131 and 132 may include a ground via, a power via, and a signal via. The first and second via layers 131 and 132 may include an electroless plating layer (or chemical copper) and an electrolytic plating layer (or electrolytic copper), but the present disclosure is not limited thereto. The first and second via layers 131 and 132 may include a sputtering layer instead of an electroless plating layer, and may include both the electroless plating layer (or chemical copper) and the sputtering layer, if necessary.

Each of the third and fourth via layers 133 and 134 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. Each of the third and fourth via layers 133 and 134 may include a micro via. The micro via may be a filled via filling a via hole or a conformal via disposed along a wall surface of the via hole. The micro via may be disposed in a stacked type and/or a staggered type. The micro vias of the third and fourth via layers 133 and 134 may perform various functions depending on the design of a corresponding layer. For example, the third and fourth via layers 133 and 134 may include a ground via, a power via, and a signal via. Each of the third and fourth via layers 133 and 134 may include an electroless plating layer (or chemical copper) and an electrolytic plating layer (or electrolytic copper), respectively, but the present disclosure is not limited thereto. The third and fourth via layers 133 and 134 may have a sputtering layer formed therein instead of an electroless plating layer, and may both the sputtering layer and the electroless plating layer. The third and fourth via layers 133 and 134 may have a shape tapered in opposite directions.

The first via layer 131 may penetrate through the glass layer 111 between the first and third blind cavities C1 and C3 and between the second and fourth blind cavities C2 and C4, and may connect at least a portion of each of the first and second wiring layers 121 and 122 to each other. The second via layer 132 may penetrate between the upper surface and the lower surface of the glass layer 111 to connect at least a portion of each of the third and fourth wiring layers 123 and 124 to each other. The third via layer 133 may penetrate through a portion of an upper side of the insulating layer 112 and may connect at least a portion of each of the third and fifth wiring layers 123 and 125 to each other. The fourth via layer 134 may penetrate through a portion of a lower side of the insulating layer 112 and may connect at least a portion of each of the fourth and sixth wiring layers 124 and 126 to each other.

Each of the first to fourth passive elements 151, 152, 153 and 154 may include a chip-type capacitor. The chip-type capacitor may include a silicon capacitor. Each silicon capacitor may include a connection pad p and a through-silicon via v. Each of the connection pad p and the through-silicon via v may include copper (Cu), aluminum (Al), silver (Ag), tin (Sn), gold (Au), nickel (Ni), lead (Pb), and titanium (Ti), and/or alloys thereof. The first to fourth passive elements 151, 152, 153 and 154 may have the same thickness or different thicknesses. For example, the first and third passive elements 151 and 153 may have substantially the same thickness. Additionally, the first and third passive elements 151 and 153 and the second and fourth passive elements 152 and 154 may have different thicknesses. From this perspective, the first and third blind cavities C1 and C3 may have substantially the same depth. Additionally, the first and third blind cavities C1 and C3 and the second and fourth blind cavities C2 and C4 may have different depths. However, this is only an example, and the thickness and depth of the first to fourth passive elements 151, 152, 153 and 154) and the first to fourth blind cavities 1, C2, C3 and C4 may have various relationships. Disposing the first to fourth passive elements 151, 152, 153 and 154 in the first to fourth blind cavities C1, C2, C3 and C4, respectively, may include disposing at least a portion of each of the first to fourth passive elements 151, 152, 153 and 154 in the first to fourth blind cavities C1, C2, C3 and C4.

The electronic component 155 may be a chip-type component and may be an active component or a passive component. For example, the electronic component 155 may be a memory chip such as a volatile memory (e.g., DRAM), a non-volatile memory (e.g., ROM), a flash memory, or the like, an application processor chip such as a central processor (e.g., CPU), a graphics processor (e.g., GPU), a digital signal processor, a cryptographic processor, a microprocessor, a microcontroller, or the like, or an active component such as a logic chip such as an analog-to-digital converter, an application-specific IC (ASIC), or the like. Alternatively, the electronic component 155 may be a passive component such as a high-frequency inductor, a ferrite inductor, a power inductor, ferrite beads, low temperature co-firing ceramics (LTCC), an electromagnetic interference (EMI) filter, and a multilayer ceramic condenser (MLCC). The electronic component 155 may be, preferably, a ceramic capacitor such as a multilayer ceramic condenser (MLCC). The electronic component 155 may have an external electrode P including copper (Cu), aluminum (Al), silver (Ag), tin (Sn), gold (Au), nickel (Ni), lead (Pb), and titanium (Ti), and/or alloys thereof. Disposing the electronic component 155 in the through-cavity H may include disposing at least a portion of the electronic component 155 in the through-cavity H.

The first electrical connection metal 160 may be formed of a low melting point metal, for example, a solder such as tin (Sn)-aluminum (Al)-copper (Cu), and the like, but this is only an example and a material thereof is not particularly limited thereto. The first electrical connection metal 160 may be formed in a multilayer or a single layer. When the first electrical connection metal 160 is formed in a multilayer structure, the first electrical connection metal 160 may include a copper pillar and a solder, and when the first electrical connection metal 160 is formed in a single layer structure, the first electrical connection metal 160 may include a tin-silver solder or copper, but the present disclosure is not limited thereto.

Figure 4:
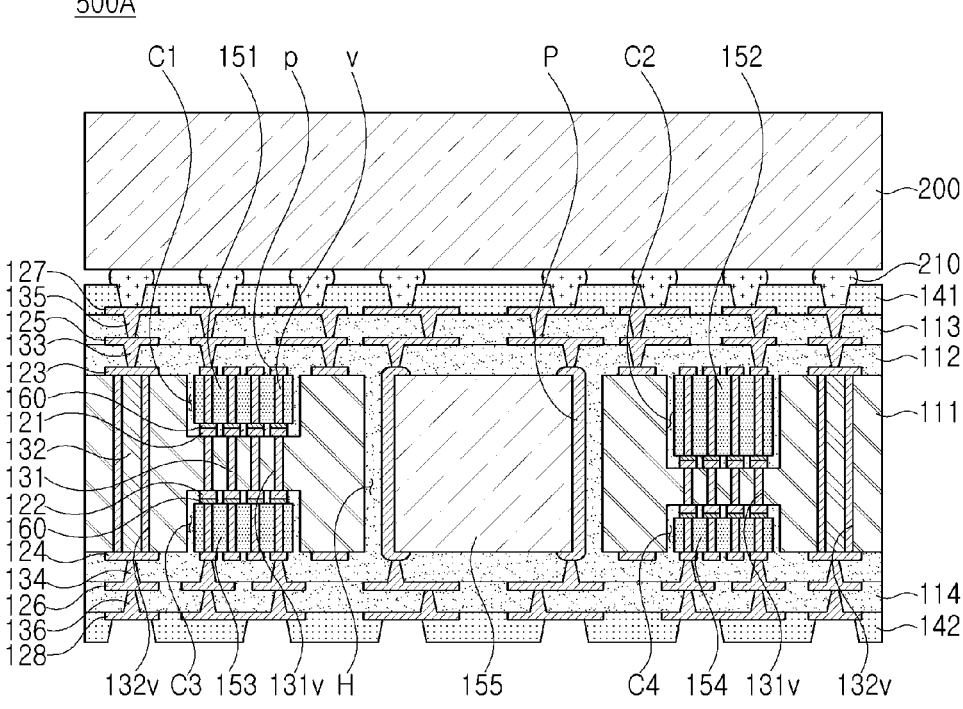
FIG. 4 is a cross-sectional view schematically illustrating a modified example embodiment of the printed circuit board of FIG. 3.

FIG. 4 is a cross-sectional view schematically illustrating a modified example embodiment of the printed circuit board of FIG. 3.

Referring to FIG. 4, a printed circuit board 500A according to a modified example embodiment may include first and second build-up insulating layers 113 and 114 respectively disposed on an upper surface and a lower surface of an insulating layer 112, a first build-up wiring layer 127 disposed on an upper surface of the first build-up insulating layer 113, a second build-up wiring layer 128 disposed on a lower surface of the second build-up insulating layer 114, a first build-up via layer 135 penetrating through the first build-up insulating layer 113, a second build-up via layer 136 penetrating through the second build-up insulating layer 114, a first resist layer 141 disposed on an upper surface of the first build-up insulating layer 113 and covering at least a portion of the first build-up wiring layer 127, a second resist layer 142 disposed on the lower surface of the second build-up insulating layer 114 and covering at least a portion of the second build-up wiring layer 128, and a semiconductor chip 200 disposed on the first resist layer 141 and connected to the first build-up wiring layer 127 through a second electrical connection metal 210, in the printed circuit board 100A according to the above-described example embodiment.

In this manner, the printed circuit board 500A according to the modified example embodiment may include the printed circuit board 100A according to the above-described example embodiment as a package board in which the first to fourth passive elements 151, 152, 153 and 154 and the electronic component 155 are embedded, and may have a form of a semiconductor package with a semiconductor chip 200 mounted thereon.

Hereinafter, the components of the printed circuit board 500A according to the modified example embodiment will be described in more detail with reference to the drawings.

Each of the first and second build-up insulating layers 113 and 114 may include an insulating material. The insulating material may include a thermosetting resin such as an epoxy resin, a thermoplastic resin such as polyimide, or a material including an inorganic filler, an organic filler, and/or a glass fiber (Glass Fiber, Glass Cloth or Glass Fabric) along with resins. For example, the insulating material may be a non-photosensitive insulating material such as an Ajinomoto Build-up Film (ABF) or Prepreg (PPG), but the present disclosure is not limited thereto, and other polymer materials may be used as the insulating materials, and the insulating material may be a photosensitive insulating material such as Photoimageable Dielectric (PID).

Each of the first and second build-up wiring layers 127 and 128 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. Each of the first and second build-up wiring layers 127 and 128 may perform various functions depending on the design. For example, the first and second build-up wiring layers 127 and 128 may include a signal pattern, a power pattern, and a ground pattern. Each of these patterns can have various forms such as a line, a plane, and a pad. The first and second build-up wiring layers 127 and 128 may include an electroless plating layer (or chemical copper) and an electrolytic plating layer (or electrical copper), respectively. Alternatively, the first and second build-up wiring layers 127 and 128 may include a metal foil (or copper foil) and an electrolytic plating layer (or electrolytic copper). Alternatively, the first and second build-up wiring layers 127 and 128 may include a metal foil (or copper foil), an electroless plating layer (or chemical copper), and an electrolytic plating layer (or electrolytic copper). The first and second build-up wiring layers 127 and 128 may include a sputtering layer instead of an electroless plating layer (or chemical copper), and may include both the sputtering layer and the electroless plating layer (or chemical copper), if necessary.

Each of the first and second build-up via layers 135 and 136 may include a metallic material. The metallic material may include copper (Cu), aluminum (Al), silver (Ag), tin (Sn), gold (Au), nickel (Ni), lead (Pb), titanium (Ti), and/or alloys thereof. The metallic material may include, preferably, copper (Cu), but the present disclosure is not limited thereto. Each of the first and second build-up via layers 135 and 136 may include a micro via. The micro via may be a filled via filling a via hole or a conformal via disposed along a wall surface of the via hole. The micro vias may be disposed as a stacked type and/or a staggered type. The micro vias of the first and second build-up via layers 135 and 136 may perform various functions depending on the design of a corresponding layer. For example, the first and second build-up via layers 135 and 136 may include a ground via, a power via, and a signal via. The first and second build-up via layers 135 and 136 may include an electroless plating layer (or chemical copper) and an electrolytic plating layer (or electrolytic copper), respectively, but the present disclosure is not limited thereto. The first and second build-up via layers 135 and 136 may have a sputtering layer formed instead of an electroless plating layer, and may include both the sputtering layer and the electroless plating layer. The first and second build-up via layers 135 and 136 may have a shape tapered in opposite directions. The first build-up via layer 135 may connect portions of each of the fifth wiring layer 125 and the first build-up wiring layer 127 to each other. The second build-up via layer 136 may connect portions of each of the sixth wiring layer 126 and the second build-up wiring layer 128 to each other.

Each of the first and second resist layers 141 and 142 may include a liquid or film-type solder resist, but the present disclosure is not limited thereto, and the first and second resist layers 141 and 142 may include other types of insulating materials such as ABF. Each of the first and second resist layers 141 and 142 may have an opening exposing at least a portion of each of the first and second build-up wiring layers 127 and 128, and a surface treatment layer may be formed on an exposed pattern, as necessary.

The semiconductor chip 200 may include an integrated circuit (IC) die in which several hundreds to several millions of elements are integrated into one chip. In this case, the integrated circuit may be, for example, a logic chip such as a central processor (e.g., CPU), a graphics processor (e.g., GPU), a field programmable gate array (FPGA), a digital signal processor, a cryptographic processor, a microprocessor, a microcontroller, and an application processor (e.g., AP), an analog-to-digital converter, or an application-specific IC (ASIC), but the present disclosure is not limited thereto, and the integrated circuit may be a memory chip such as a volatile memory (e.g., DRAM), a non-volatile memory (e.g., ROM), a flash memory, a high bandwidth memory (HBM), or the like, or other types such as a power management IC (PMIC).

The semiconductor chip 200 may be formed based on an active wafer, in which case silicon (Si), germanium (Ge), gallium arsenide (GaAs), and the like, may be used as a base material forming each body. Various circuits may be formed in the body. A connection pad may be formed on the body, and the connection pad may include a conductive material such as aluminum (Al) or copper (Cu). The semiconductor chip 200 may be a bare die, and in this case, metal bumps may be disposed on the connection pad. The semiconductor chip 200 may be a packaged die, in which case a redistribution layer may be further formed on the connection pad, and metal bumps may be disposed on the redistribution layer.

The second electrical connection metal 210 may be formed of a low melting point metal, for example, a solder such as tin (Sn)-aluminum (Al)-copper (Cu), but this is only an example and a material thereof is not particularly limited thereto. The second electrical connection metal 210 may be formed in a multilayer or a single layer. When the second electrical connection metal 210 is formed in a multilayer, second electrical connection metal 210 may include a copper pillar and a solder, and when the second electrical connection metal 210 is formed in a single layer, the second electrical connection metal 210 may include a tin-silver solder or copper, but the present disclosure is not limited thereto.

Other contents are substantially the same as those described in the printed circuit board 100A according to the above-described example embodiment, and thus, redundant descriptions thereof will be omitted.

FIGS. 5A to 5G are process cross-sectional views schematically illustrating an example embodiment of manufacturing the printed circuit board of FIG. 3.

Figure 5A:
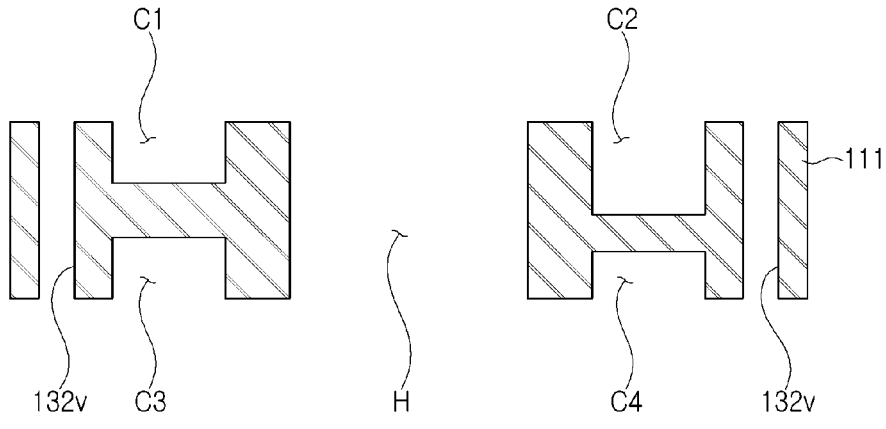
FIGS. 5A to 5G are process cross-sectional views schematically illustrating an example embodiment of manufacturing the printed circuit board of FIG. 3.

Referring to FIG. 5A, a glass layer 111 is prepared. The glass layer 111 may be in the form of plate glass. Next, first to fourth blind cavities C1, C2, C3 and C4, a through-cavity H, and a second through-hole 132*v* are formed in the glass layer 111. The first to fourth blind cavities C1, C2, C3 and C4, the through-cavity H and the second through-hole 132*v* may be formed by etching using a mask, but the present disclosure is not limited thereto. Meanwhile, when using the glass layer 111, it may be easy to adjust a depth of the first to fourth blind cavities C1, C2, C3 and C4, and various depths may be formed. Furthermore, the glass layer 111 has high rigidity properties, and even if a gap between the first to fourth blind cavities C1, C2, C3 and C4 is narrow, a risk of deformation may be reduced.

Figure 5B:
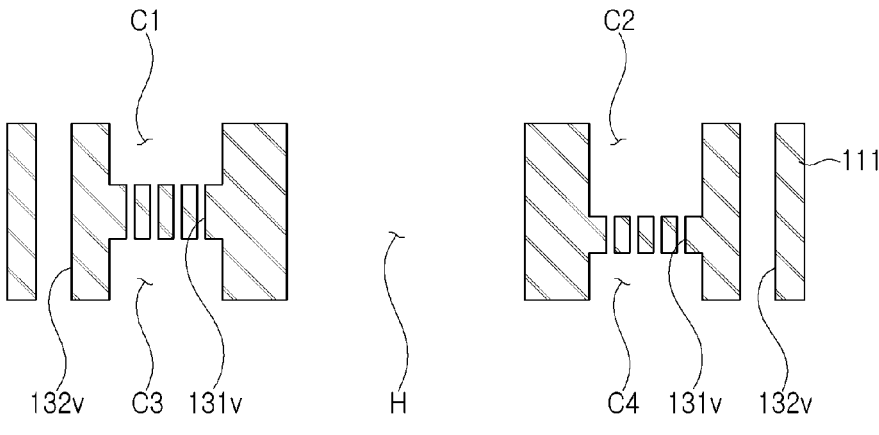

Referring to FIG. 5B, a first through-hole 131*v* is formed in the glass layer 111. The first through-hole 131*v* may also be formed by etching using a mask, but the present disclosure is not limited thereto. Even in this case, the above-described effect may be achieved by the glass layer 111.

Figure 5C:
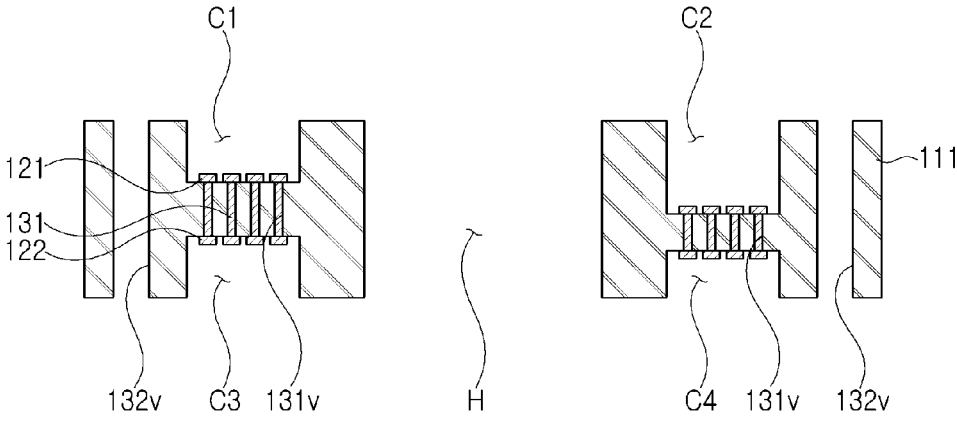

Referring to FIG. 5C, first and second wiring layers 121 and 122 and a first via layer 131 are formed on the glass layer 111. The first and second wiring layers 121 and 122 and the first via layer 131 may be formed in a plating process, and may be formed using, for example, an Additive Process (AP), a Semi AP (SAP), a Modified SAP (MSAP), Tenting (TT), or the like.

Figure 5D:
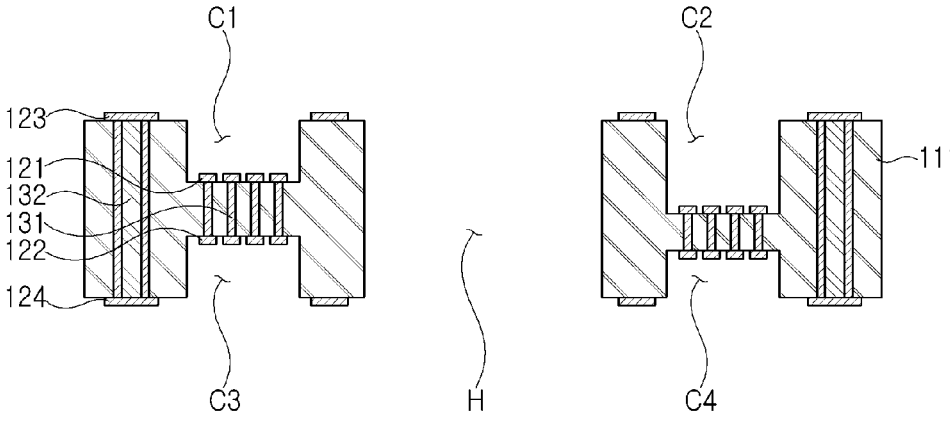

Referring to FIG. 5D, third and fourth wiring layers 123 and 124 and a second via layer 132 are formed on the glass layer 111. The third and fourth wiring layers 123 and 124 and the second via layer 132 may also be formed in a plating process, and may be formed using, for example, an Additive Process (AP), a Semi AP (SAP), a Modified SAP (MSAP), Tenting (TT), or the like. When forming the second via layer 132, a plugging process may be further performed after the plating process.

Figure 5E:
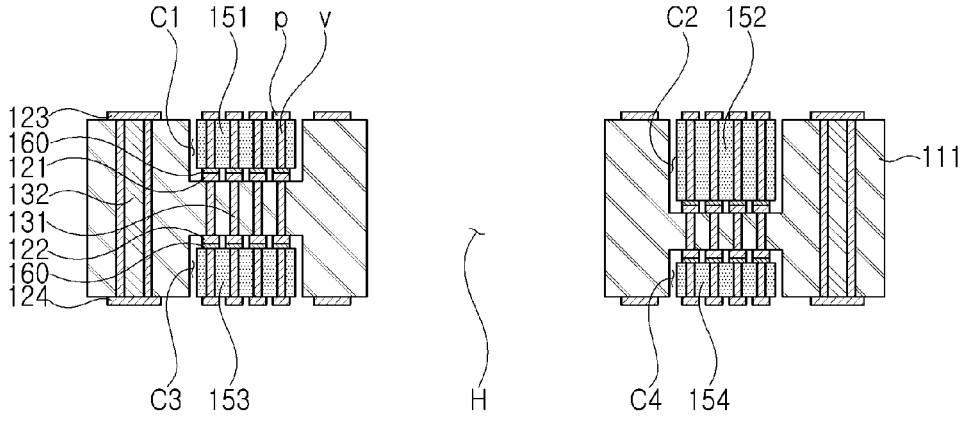

Referring to FIG. 5E, first to fourth passive elements 151, 152, 153 and 154 are disposed in the first to fourth blind cavities C1, C2, C3 and C4, respectively. In this case, the first to fourth passive elements 151, 152, 153 and 154 may be connected to the first and second wiring layers 121 and 122 through a first electrical connection metal 160. On the other hand, when using the glass layer 111, and even if soldering is performed on a narrow gap, a risk of deformation due to heat may be low.

Figure 5F:
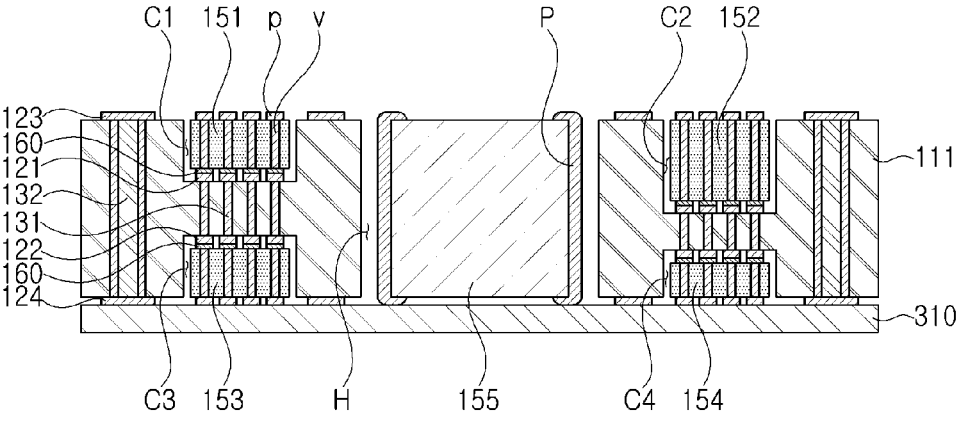

Referring to FIG. 5F, an electronic component 155 is disposed in the through-cavity H. For example, the electronic component 155 may be disposed in the through-cavity H by attaching a tape 310 to a lower side of the glass layer 111 and then attaching the electronic component 155 to the tape 310.

Figure 5G:
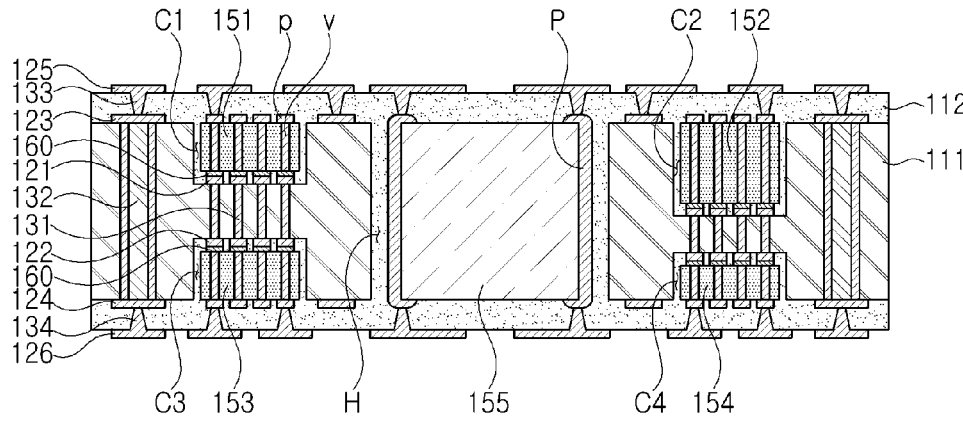

Referring to FIG. 5G, an insulating layer 112 is formed. The insulating layer 112 may be formed in a manner in which a portion of the insulating layer 112 is formed on the tape 310 and another portion thereof is formed in a region from which the tape 310 has been removed. The insulating layer 112 may be formed in a lamination process while attached to a film such as PolyEthylene Terephthalate (PET). Next, the fifth and sixth wiring layers 125 and 126 and the third and fourth via layers 133 and 134 are formed on the insulating layer 112. Via holes for forming the third and fourth via layers 133 and 134 may be formed using a laser drill, or the like. The fifth and sixth wiring layers 125 and 126 and the third and fourth via layers 133 and 134 may also be formed in a plating process, and may be formed using, for example, an Additive Process (AP), a Semi AP (SAP), a Modified SAP (MSAP), Tenting (TT), or the like.

The printed circuit board 100A according to the above-described example embodiment may be manufactured through a series of processes, and other redundant descriptions thereof will be omitted.

Figure 6:
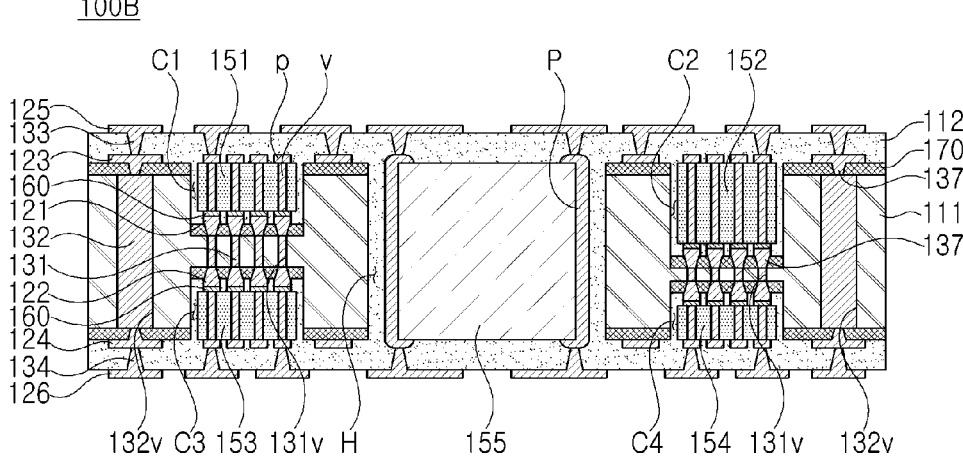
FIG. 6 is a cross-sectional view schematically illustrating another example embodiment of a printed circuit board.

FIG. 6 is a cross-sectional view schematically illustrating another example embodiment of a printed circuit board.

Figure 7:
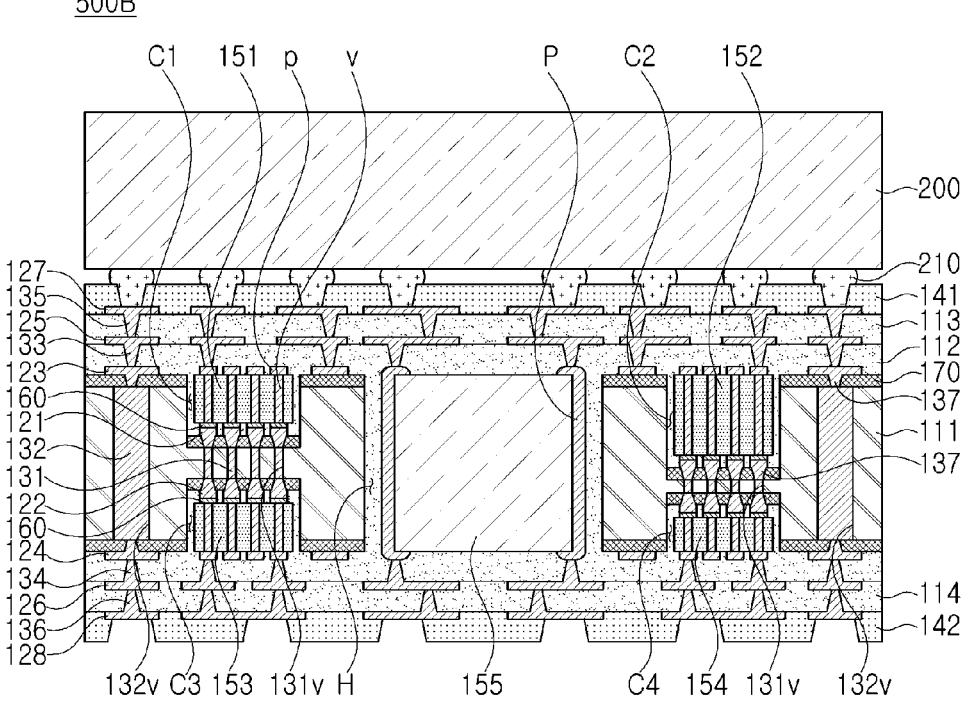
FIG. 7 is a cross-sectional view schematically illustrating a modified example embodiment of the printed circuit board of FIG. 6.

FIG. 7 is a cross-sectional view schematically illustrating a modified example embodiment of the printed circuit board of FIG. 6.

Referring to the drawings, a printed circuit board 100B according to another example embodiment and a printed circuit board 500B according to a modified example embodiment may further include an insulating material 170 disposed between each of the first to fourth wiring layers 121, 122, 123 and 124 and the glass layer 111, and a fifth via layer 137 penetrating through the insulating material 170 and connecting at least a portion of each of the first to fourth wiring layers 121, 122, 123 and 124 and the first and second via layers 131 and 132 to each other, in the printed circuit board 100A according to the above-described example embodiment and the printed circuit board 500A according to the modified example embodiment. The insulating material 170 may include the insulating material described in the insulating layer 112. The glass layer 111 may be protected through the insulating material 170, and adhesion with the insulating layer 112 may be improved. Furthermore, adhesion with the first to fourth wiring layers 121, 122, 123 and 124 may be improved, and plating to form the first to fourth wiring layers 121, 122, 123 and 124 may be performed more easily. Meanwhile, for electrical conduction and easier connection with the fifth via layer 137, the glass through-via of the second via layer 132 may be filled only with plating without plugging, similarly to the glass through-via of the first via layer 131.

Other contents are substantially the same as those described in the printed circuit board 100A according to the above-described example embodiment and the printed circuit board 500A according to the modified example embodiment, and thus, redundant descriptions thereof will be omitted.

FIGS. 8A to 8H are process cross-sectional views schematically illustrating an example embodiment of manufacturing the printed circuit board of FIG. 6.

Figure 8A:
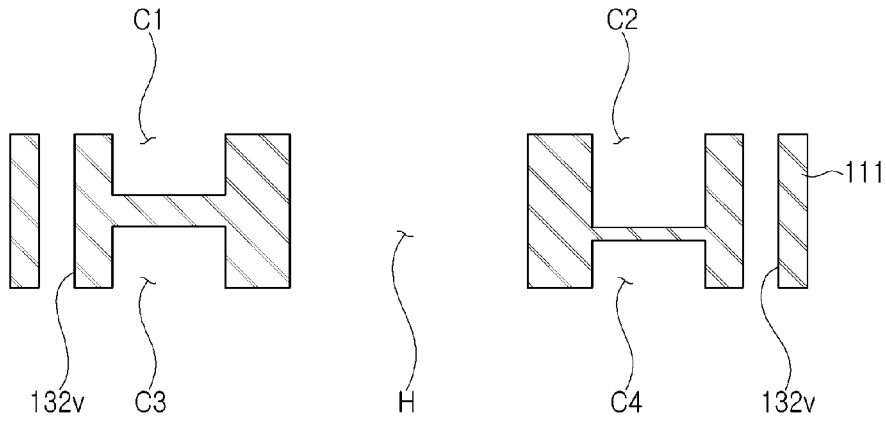
FIGS. 8A to 8H are process cross-sectional views schematically illustrating an example embodiment of manufacturing the printed circuit board of FIG. 6.
Figure 8B:
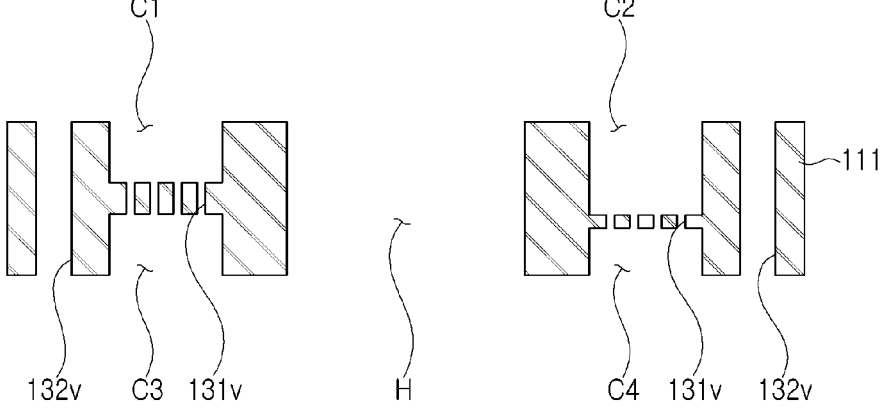

Referring to FIGS. 8A and 8B, a glass layer 111 is prepared as described in FIGS. 5A and 5B above. Next, first to fourth blind cavities C1, C2, C3 and C4, a through-cavity H, and first and second through-holes 131v and 132v are formed in the glass layer 111.

Figure 8C:
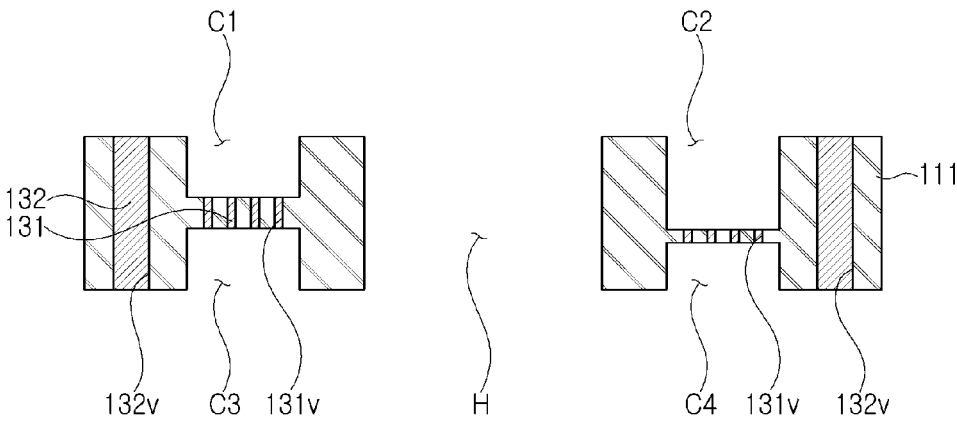

Referring to FIG. 8C, first and second via layers 131 and 132 are formed on the glass layer 111. The first and second via layers 131 and 132 may be formed by filling the first and second through-holes 131v and 132v with a metallic material using a plating process.

Figure 8D:
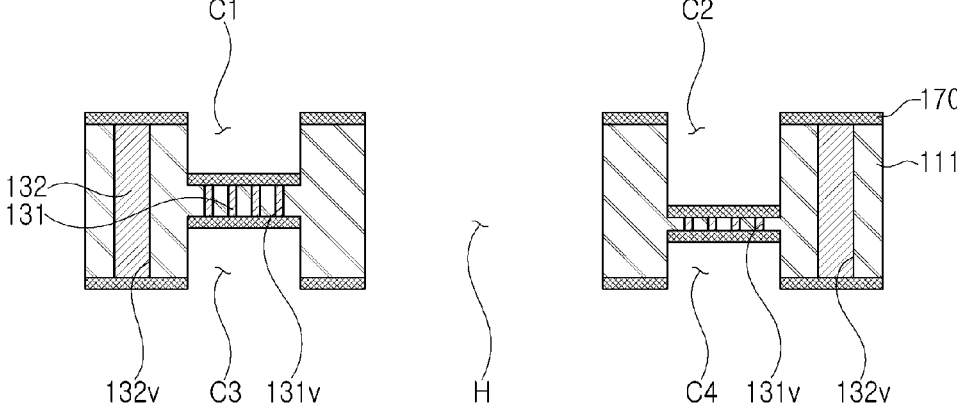

Referring to FIG. 8D, the insulating material 170 is formed. For example, the insulating material 170 is coated on an upper surface and a lower surface of the glass layer 111 and bottom surfaces of each of the first to fourth blind cavities C1, C2, C3 and C4.

Figure 8E:
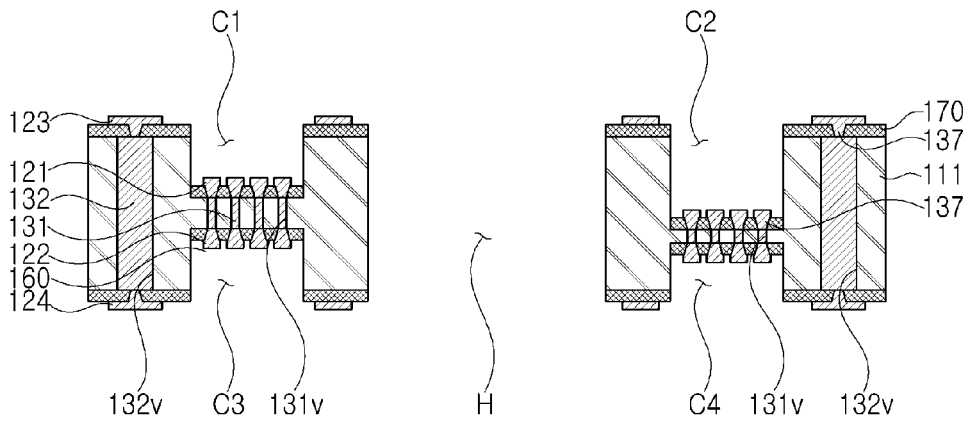

Referring to FIG. 8E, first to fourth wiring layers 121, 122, 123 and 124 and a fifth via layer 137 are formed on the insulating material 170. The first to fourth wiring layers 121, 122, 123 and 124 and the fifth via layer 137 may be formed in a plating process, and may be formed using, for example, an Additive Process (AP), a Semi AP (SAP), a Modified SAP (MSAP), Tenting (TT), or the like.

Figure 8F:
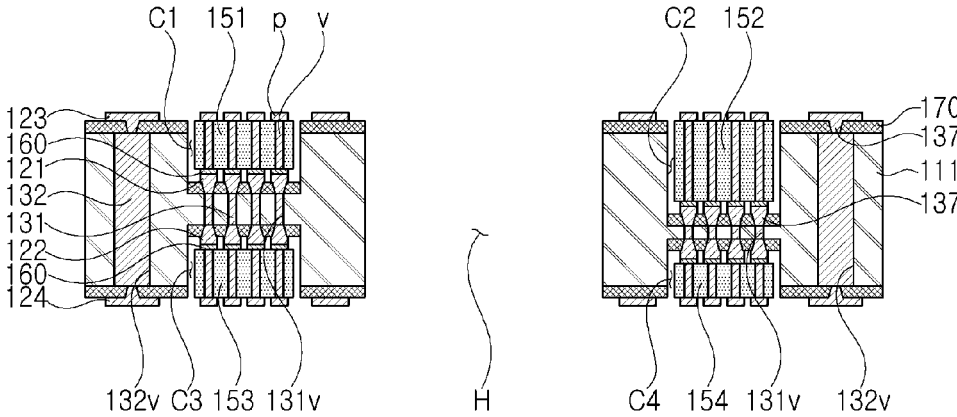
Figure 8G:
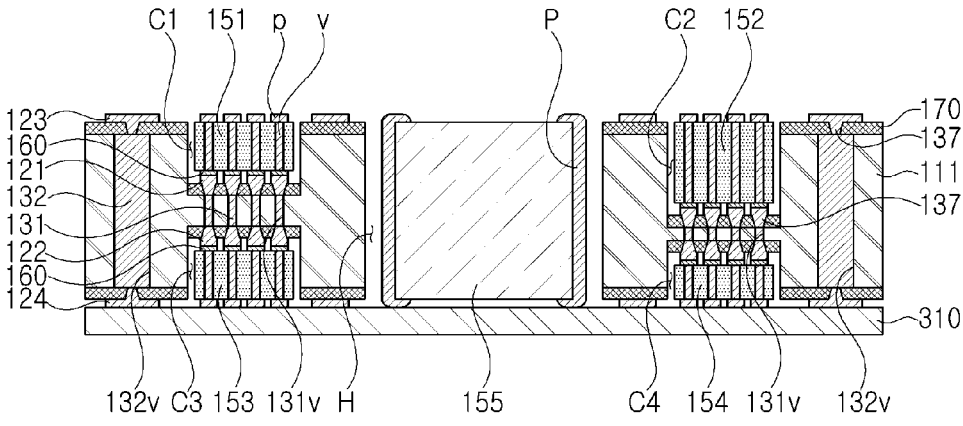
Figure 8H:
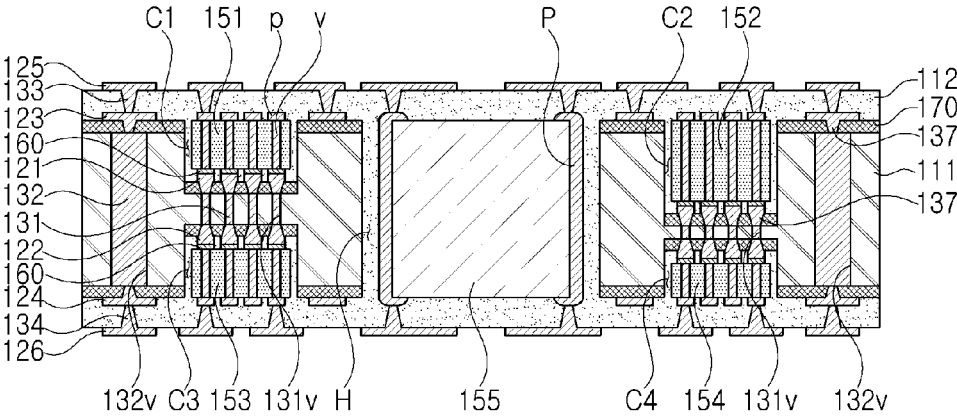

Referring to FIGS. 8F to 8H, as described in FIGS. 5E to 5G, first to fourth passive elements 151, 152, 153 and 154 are respectively disposed in the first to fourth blind cavities C1, C2, C3 and C4. Next, an electronic component 155 is disposed in the through-cavity H. Next, the insulating layer 112 is formed. Next, the fifth and sixth wiring layers 125 and 126 and the third and fourth via layers 133 and 134 are formed on the insulating layer 112.

A printed circuit board 100B according to another example embodiment described above may be manufactured through a series of processes, and other redundant descriptions thereof will be omitted.

Figure 9:
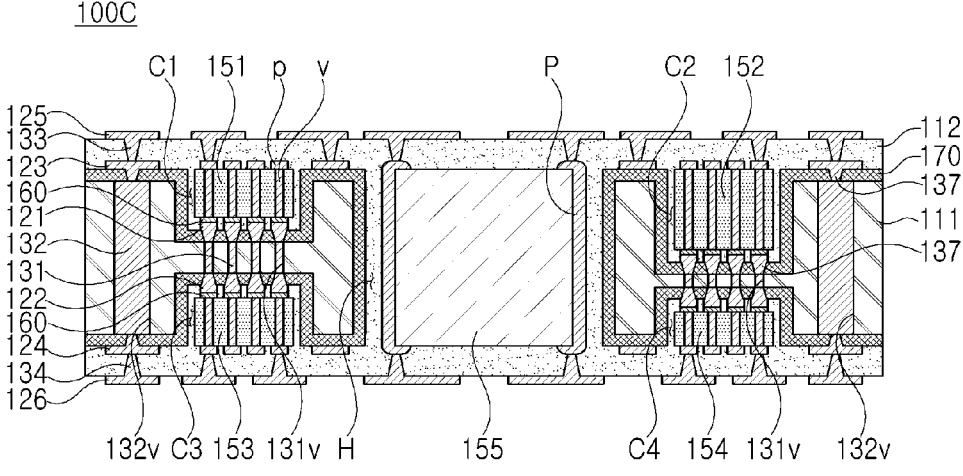
FIG. 9 is a cross-sectional view schematically illustrating another example embodiment of a printed circuit board.

FIG. 9 is a cross-sectional view schematically illustrating another example embodiment of a printed circuit board.

Figure 10:
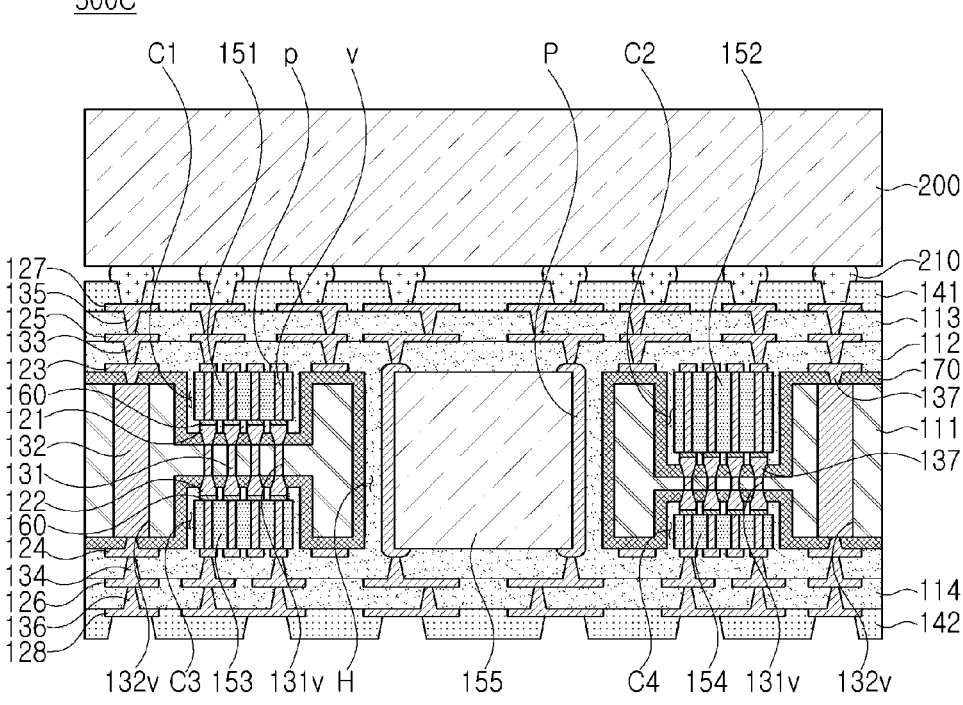
FIG. 10 is a cross-sectional view schematically illustrating a modified example embodiment of the printed circuit board of FIG. 9.

FIG. 10 is a cross-sectional view schematically illustrating a modified example embodiment of the printed circuit board of FIG. 9.

Referring to the drawings, in a printed circuit board 100C according to another example embodiment and a printed circuit board 500C according to a modified example embodiment, an insulating material 170 may extend on wall surfaces of each of the first to fourth blind cavities C1, C2, C3 and C4 and the through-cavity H, in the printed circuit board 100B according to another example embodiment described above and the printed circuit board 500B according to the modified example embodiment. Accordingly, the wall surfaces of each of the first to fourth blind cavities C1, C2, C3 and C4 and the through-cavity H may be protected, and adhesion with the insulating layer 112 may be further improved.

Other contents are substantially the same as those described in the printed circuit board 100A according to the above-described example embodiment and the printed circuit board 500A according to the modified example embodiment, and the printed circuit board 100B according to another example embodiment described above and the printed circuit board 500B according to the modified example embodiment, and thus, redundant descriptions thereof are omitted.

FIGS. 11A to 11H are process cross-sectional views schematically illustrating an example embodiment of manufacturing the printed circuit board of FIG. 9.

Figure 11A:
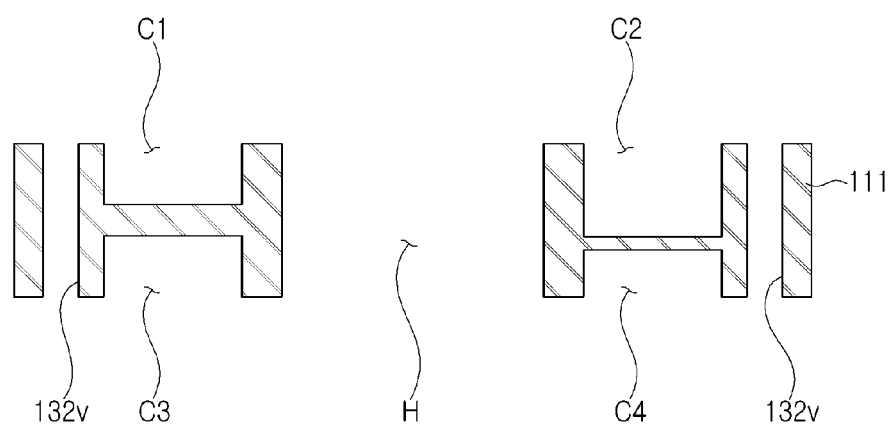
FIGS. 11A to 11H are process cross-sectional views schematically illustrating an example embodiment of manufacturing the printed circuit board of FIG. 9.
Figure 11B:
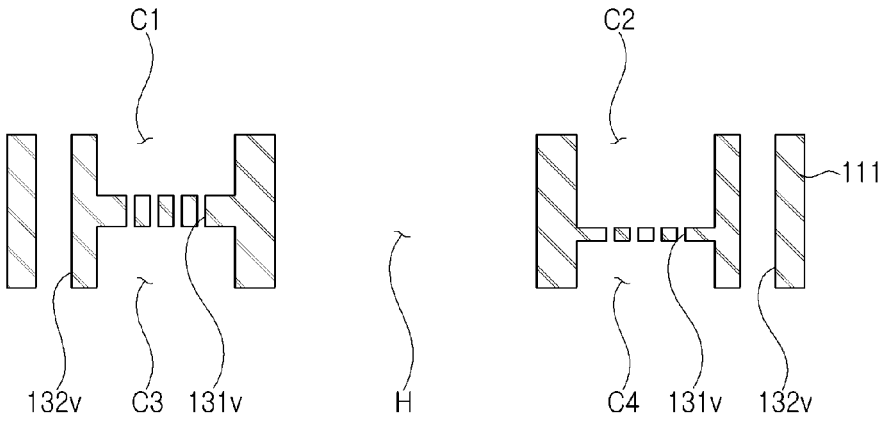
Figure 11C:
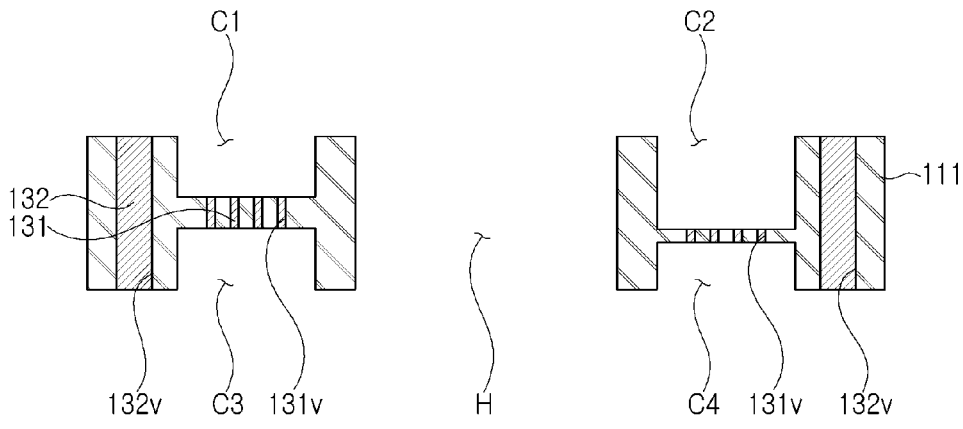

Referring to FIGS. 11A to 11C, a glass layer 111 is prepared as described in FIGS. 5A and 5B and 8A to 8C. Next, first to fourth blind cavities C1, C2, C3 and C4, a through-cavity H, and first and second through holes 131v and 132v are formed in the glass layer 111. Next, first and second via layers 131 and 132 are formed on the glass layer 111.

Figure 11D:
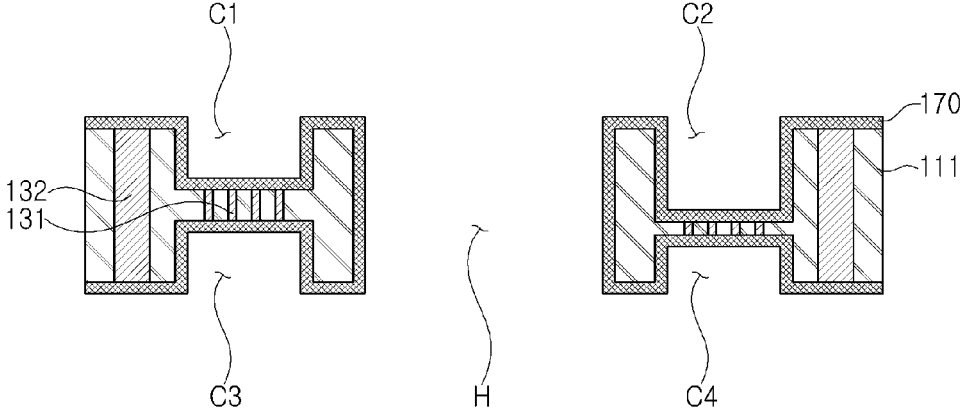
Figure 11E:
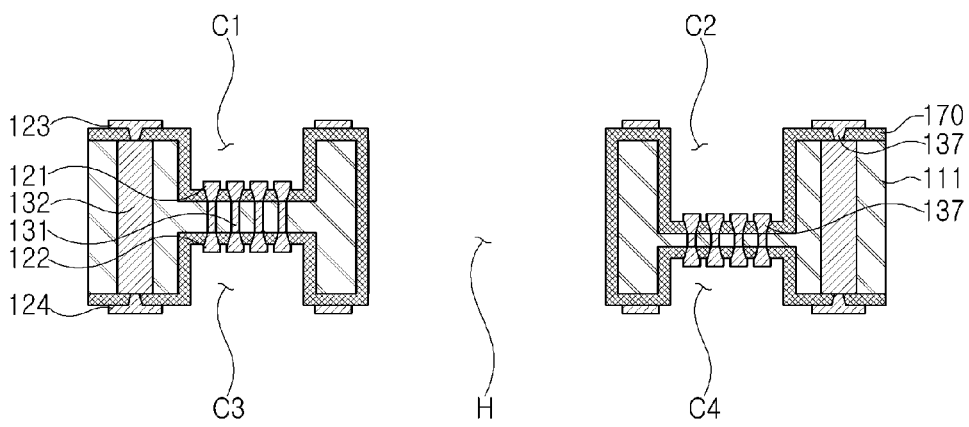
Figure 11F:
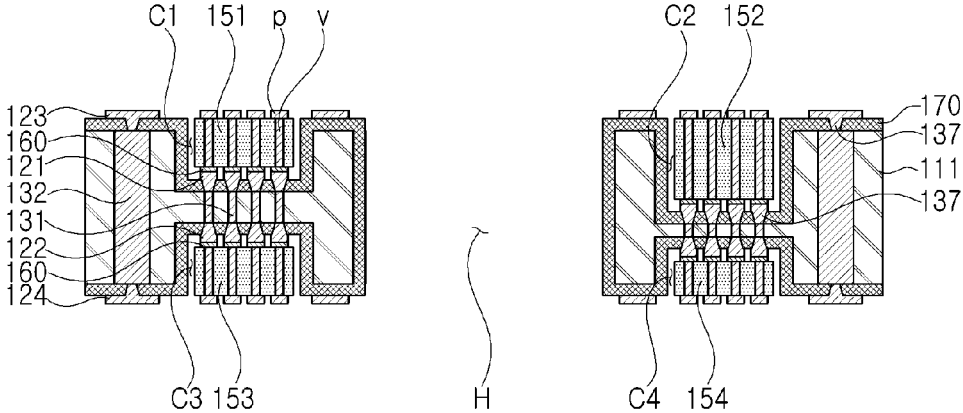
Figure 11G:
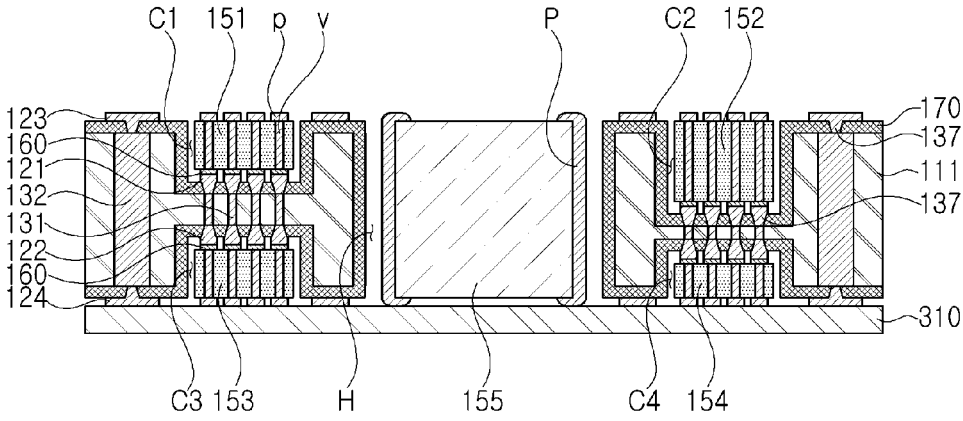
Figure 11H:
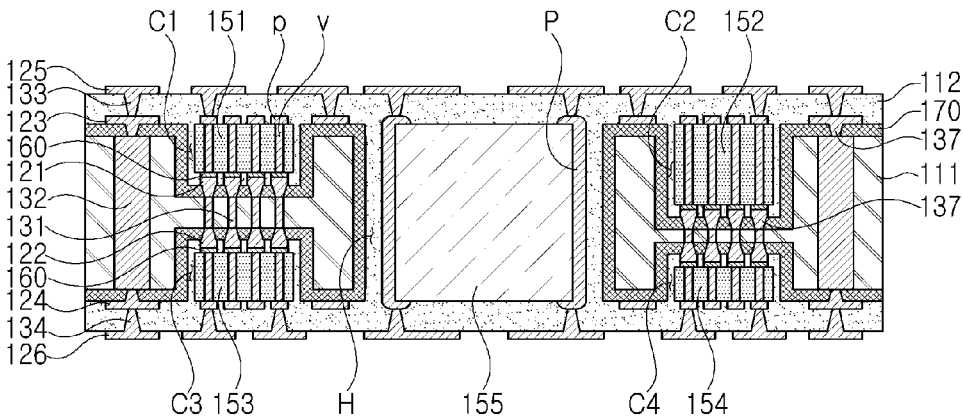

Referring to FIG. 11D, an insulating material 170 is formed. For example, the insulating material 170 is coated on an upper surface and a lower surface of the glass layer 111, bottom surfaces of each of the first to fourth blind cavities C1, C2, C3 and C4, and a wall surface of the through-cavity H.

Referring to FIGS. 11E to 11H, as described above with FIGS. 5E to 5G and 8E to 8H, first to fourth wiring layers 121, 122, 123 and 124 and a fifth via layer 137 are formed on the insulating material 170. Next, first to fourth passive elements 151, 152, 153 and 154 are disposed in the first to fourth blind cavities C1, C2, C3 and C4, respectively. Next, the electronic component 155 is disposed in the through-cavity H. Next, an insulating layer 112 is formed. Next, fifth and sixth wiring layers 125 and 126 and third and fourth via layers 133 and 134 are formed on the insulating layer 112.

The printed circuit board 100C according to another example described above may be manufactured through a series of processes, and other redundant descriptions thereof will be omitted.

In the present disclosure, the expression 'covering' may include a case of covering at least a portion as well as a case of covering the whole, and may also include a case of covering not only directly but also indirectly. Furthermore, the expression 'filling' may include not only a case of completely filling but also a case of approximately filling, and may include, for example, a case in which some pores or voids exist.

In the present disclosure, the meaning on the cross-section may refer to a cross-sectional shape when an object is cut vertically, or a cross-sectional shape when the object is viewed in a side-view. Furthermore, the meaning on a plane may refer to a planar shape when the object is horizontally cut, or a planar shape when the object is viewed in a top-view or a bottom-view.

In the present disclosure, a thickness, a width, a length, a depth, and the like may be measured with a scanning microscope or an optical microscope based on a cross-section in which a printed circuit board is polished or cut. The cut cross-section may be a vertical cross-section or a horizontal cross-section, and each numerical value thereof may be measured based on a required cut cross-section. When the numerical value is not constant, the numerical value may be determined as an average value of values measured at any five points. A width of an upper end and/or a lower end of a via or a cavity may be measured on a cross-section obtained by cutting a central axis of a via or a cavity in a thickness direction of a substrate. A depth of the via or the cavity may be measured as a distance from an upper end to a lower end of each object on a cross-section obtained by cutting a central axis of each object in the thickness direction of the substrate.

In the present disclosure, a lower side, a lower portion, and a lower surface are used to refer to a downward direction with respect to a cross-section of a drawing, and an upper side, an upper portion, and an upper surface are used to refer to an opposite direction thereof. Furthermore, a side portion, a side surface, and the like, are used to denote directions, perpendicular to upper and lower surfaces. However, this defines the direction for convenience of explanation, and the scope of the rights of the claims is not particularly limited by the description of such a direction, and the concept of upper and lower portions may be changed at any time.

In the present disclosure, a meaning of being connected is a concept including not only directly connected but also indirectly connected through an adhesive layer or the like. Furthermore, a meaning of electrically connected is a concept including both physically connected and not connected. In addition, expressions such as first and second are used to distinguish one component from another, and do not limit the order and/or importance of the components. In some cases, a first component may be referred to as a second component without departing from the scope of rights, or similarly, the second component may be referred to as the first component.

The expression 'example embodiment used in the present disclosure' does not mean the same embodiment, and is provided to explain different unique characteristics. However, the example embodiments presented above do not preclude being implemented in combination with features of other example embodiments. For example, even if matters described in a particular example embodiment are not described in other example embodiments, they may be understood as explanations related to other example embodiments unless there is an explanation contrary to or contradictory to matters in other example embodiments.

The terms used in the present disclosure are used only to describe an example embodiment and are not intended to limit the present disclosure. In this case, singular expressions include plural expressions unless they are clearly meant differently in the context.

While example embodiments have been illustrated and described above, it will be apparent to those skilled in the art that modifications and variations could be made without departing from the scope of the present disclosure as defined by the appended claims.

What is claimed is:

1. A printed circuit board, comprising:
a glass layer;
a plurality of blind cavities respectively penetrating through a portion of the glass layer from an upper surface or a lower surface of the glass layer;
a plurality of passive elements respectively disposed in the plurality of blind cavities; and
an insulating layer covering at least a portion of each of the glass layer and the plurality of passive elements and disposed in at least a portion of each of the plurality of blind cavities,
wherein at least two of the plurality of blind cavities have different depths,
the plurality of blind cavities include first and second blind cavities respectively penetrating through a portion of the glass layer from the upper surface of the glass layer, and third and fourth blind cavities respectively penetrating through a portion of the glass layer from the lower surface of the glass layer, and
the plurality of passive elements include first to fourth passive elements respectively disposed in the first to fourth blind cavities.

2. The printed circuit board according to claim 1, further comprising:
a through-cavity penetrating between the upper surface and the lower surface of the glass layer; and
an electronic component disposed in the through-cavity,
wherein the insulating layer further covers the electronic component and is further disposed in at least a portion of the through-cavity.

3. The printed circuit board according to claim 2, wherein the electronic component is thicker than each of the plurality of passive elements.

4. The printed circuit board according to claim 3, wherein one of the plurality of passive elements includes a silicon capacitor, and
the electronic component includes a ceramic capacitor.

5. The printed circuit board according to claim 1, wherein based on a thickness direction,
the first and third blind cavities at least partially overlap each other, and
the second and fourth blind cavities at least partially overlap each other.

6. The printed circuit board according to claim 5, further comprising:
a first wiring layer disposed on bottom surfaces of the first and second blind cavities;
a second wiring layer disposed on bottom surfaces of the third and fourth blind cavities;
third and fourth wiring layers respectively disposed on the upper surface and the lower surface of the glass layer;
fifth and sixth wiring layers respectively disposed on an upper surface and a lower surface of the insulating layer;
a first via layer penetrating through the glass layer between the first and third blind cavities and between the second and fourth blind cavities, and connecting at least a portion of each of the first and second wiring layers to each other;
a second via layer penetrating between the upper surface and the lower surface of the glass layer, and connecting at least a portion of each of the third and fourth wiring layers to each other;
a third via layer penetrating through a portion of an upper side of the insulating layer and connecting at least a portion of each of the third and fifth wiring layers to each other; and
a fourth via layer penetrating through a portion of a lower side of the insulating layer, and connecting at least a portion of each of the fourth and sixth wiring layers to each other.

7. The printed circuit board according to claim 6, wherein each of the first to fourth passive elements includes a through-silicon via, and
the through-silicon via of each of the first to fourth passive elements is connected to at least a portion of each of the first and second wiring layers through a first electrical connection metal, respectively.

8. The printed circuit board according to claim 6, further comprising:
an insulating material disposed between each of the first to fourth wiring layers and the glass layer; and
a fifth via layer penetrating through the insulating material, and connecting at least a portion of each of the first to fourth wiring layers and the first and second via layers to each other.

9. The printed circuit board according to claim 8, wherein the insulating material is disposed to extend on a wall surface of each of the first to fourth blind cavities.

10. The printed circuit board according to claim 6, further comprising:
first and second build-up insulating layers respectively disposed on the upper surface and the lower surface of the insulating layer;
a first build-up wiring layer disposed on an upper surface of the first build-up insulating layer;

a second build-up wiring layer disposed on a lower surface of the second build-up insulating layer;

a first build-up via layer penetrating through the first build-up insulating layer, and connecting at least a portion of each of the fifth wiring layer and the first build-up wiring layer to each other;

a second build-up via layer penetrating through the second build-up insulating layer, and connecting at least a portion of each of the sixth wiring layer and the second build-up wiring layer to each other;

a first resist layer disposed on an upper surface of the first build-up insulating layer, and covering at least a portion of the first build-up wiring layer;

a second resist layer disposed on a lower surface of the second build-up insulating layer, and covering at least a portion of the second build-up wiring layer; and a semiconductor chip disposed on the first resist layer, and connected to the first build-up wiring layer through a second electrical connection metal.

11. The printed circuit board according to claim 1, wherein the glass layer includes plate glass.

12. A printed circuit board, comprising:

a glass layer;

a blind cavity penetrating through a portion of the glass layer from an upper surface or a lower surface of the glass layer;

a through-cavity penetrating between the upper surface and the lower surface of the glass layer;

a passive element disposed in the blind cavity;

an electronic component disposed in the through-cavity;

an insulating layer covering at least a portion of each of the glass layer, the passive element, and the electronic component, and disposed in at least a portion of each of the blind cavity and the through-cavity;

a first wiring layer disposed on a bottom surface of the blind cavity;

third and fourth wiring layers respectively disposed on the upper and lower surfaces of the glass layer;

first and second build-up insulating layers respectively disposed on an upper surface and a lower surface of the insulating layer;

a first build-up wiring layer disposed on an upper surface of the first build-up insulating layer;

a second build-up wiring layer disposed on a lower surface of the second build-up insulating layer;

a first resist layer disposed on an upper surface of the first build-up insulating layer, and covering at least a portion of the first build-up wiring layer; and a second resist layer disposed on a lower surface of the second build-up insulating layer, and covering at least a portion of the second build-up wiring layer.

13. The printed circuit board according to claim 12, wherein the passive element includes a silicon capacitor, and the electronic component includes a ceramic capacitor.

14. The printed circuit board according to claim 12, further comprising:

a semiconductor chip disposed on the first resist layer, and connected to the first build-up wiring layer through an electrical connection metal.

15. A printed circuit board, comprising:

a glass layer;

a first blind cavity penetrating through a portion of the glass layer from an upper surface of the glass layer;

a second blind cavity penetrating through another portion of the glass layer from a lower surface of the glass layer;

first and second passive elements respectively disposed in the first and second blind cavities, and connected to each other through a first via layer disposed in a portion of the glass layer between the first blind cavity and the second blind cavity; and an insulating layer covering at least a portion of each of the glass layer and the first and second passive elements and disposed in at least a portion of the first and second blind cavities.

16. The printed circuit board according to claim 15, wherein the first and second passive elements have different thicknesses.

17. The printed circuit board according to claim 16, further comprising:

a through-cavity penetrating between the upper surface and the lower surface of the glass layer; and an electronic component disposed in the through-cavity and having a thickness greater than the first and second passive elements, wherein the insulating layer further covers the electronic component and is further disposed in at least a portion of the through-cavity.

18. The printed circuit board according to claim 15, further comprising:

a first wiring layer disposed on a bottom surface of the first blind cavity and connected to the first passive element;

a second wiring layer disposed on a bottom surface of the second blind cavity and connected to the second passive element;

third and fourth wiring layers respectively disposed on the upper surface and the lower surface of the glass layer;

fifth and sixth wiring layers respectively disposed on an upper surface and a lower surface of the insulating layer;

a second via layer penetrating between the upper surface and the lower surface of the glass layer, and connecting at least a portion of each of the third and fourth wiring layers to each other;

a third via layer penetrating through a portion of an upper side of the insulating layer and connecting at least a portion of each of the third and fifth wiring layers to each other; and a fourth via layer penetrating through a portion of a lower side of the insulating layer, and connecting at least a portion of each of the fourth and sixth wiring layers to each other, wherein the first via layer connects at least a portion of each of the first and second wiring layers to each other.

19. The printed circuit board according to claim 18, wherein the third via layer connects the fifth wiring layer to a pad of the first passive element, and the fourth via layer connects the sixth wiring layer to a pad of the second passive element.

20. The printed circuit board according to claim 15, wherein the glass layer includes plate glass.

* * * * *